United States Patent [19]

Noguchi

[11] Patent Number: 5,068,259

[45] Date of Patent: Nov. 26, 1991

[54] RESIN COMPOSITION CURBABLE WITH AN ACTIVE ENERGY RAY CONTAINING EPOXY RESIN AND MONOMER WITH ETHYLENICALLY UNSATURATED BOND

[75] Inventor: Hiromichi Noguchi, Atsugi, Japan

[73] Assignee: Canon Kabushiki Kaisha, Tokyo, Japan

[21] Appl. No.: 244,303

[22] Filed: Sep. 15, 1988

[30] Foreign Application Priority Data

Sep. 16, 1987 [JP] Japan ................... 62-229492
Jun. 29, 1988 [JP] Japan ................... 63-159077

[51] Int. Cl.$^5$ ............... C08L 51/00; C08L 33/04; C08L 47/00; C08G 63/48
[52] U.S. Cl. .................... 522/31; 522/102; 522/109; 525/65; 525/84; 525/85; 525/77; 525/75
[58] Field of Search .......... 522/31, 102, 109; 525/65, 80, 84, 85, 77, 75, 108, 190

[56] References Cited

U.S. PATENT DOCUMENTS 4,688,053 8/1987 Noguchi et al. ............ 522/121
4,688,056 8/1987 Noguchi et al. ............ 522/102

*Primary Examiner*—Marion E. McCamish
*Assistant Examiner*—Susan Berman
*Attorney, Agent, or Firm*—Fitzpatrick Cella Harper & Scinto

[57] ABSTRACT

An improved active energy ray-curing resin composition comprising (i) a graft copolymerized polymer having a number average molecular weight of 5,000 or more and a weight average molecular weight of 50,000 or less: (ii) a linear polymer having a number average molecular weight of 5,000 or more and a weight average molecular weight of 350,000 or less and having a glass transition temperature of 60° C. or more: (iii) an epoxy resin containing at least one compound having one or more epoxy groups in one molecule, (iv) a monomer having an ethylenically unsaturated bond and (v) a polymerization initiator capable of generating a Lewis acid by irradiation of an active energy ray. The resin composition can be desirably cured with an active energy ray such as ultraviolet ray or electron beam and it is capable of being laminated in a desired pattern on a copper-coated laminate for use as a printed board or on a plate of metal, glass, ceramics or plastic.

6 Claims, No Drawings

RESIN COMPOSITION CURBABLE WITH AN ACTIVE ENERGY RAY CONTAINING EPOXY RESIN AND MONOMER WITH ETHYLENICALLY UNSATURATED BOND

FIELD OF THE INVENTION

This invention relates to a resin composition curable with an active energy ray such as ultraviolet ray or electron beam. More particularly, it relates to an improved resin composition curable with said active energy ray which is capable of being laminated in a desired pattern on a copper-coated laminate for use as a printed board or on a plate of metal, glass, ceramics or plastic.

BACKGROUND OF THE INVENTION

In recent years, there have been often used various resin compositions curable with an active energy ray in coatings or inks, or as a sealing material, as a resist material, as a material for forming a protective film or as a material for forming a pattern. As such resin compositions, for use in forming a protective film for printed wiring board or for use as a resist material for forming a wiring pattern therefor, there are known, for example, a dry film resist containing a high molecular material capable of forming a film under the trade name of RISTON (produced by Du Pont Japan Ltd.) and a thick film liquid resist according to photographic method under the trade name of PROBIMER (produced by Ciba Geigy Co.).

These known resin compositions comprise mainly (a) high molecular materials contributing to formation of a film or a dry coating and (b) a material curable with an active energy ray. And for these resin compositions, their adhesiveness with a substrate, their developing properties for the formation of a pattern, their durability, painting property and drying property as a paint film are varied depending upon the kinds and the molecular structures of said high molecular materials (a). Therefore, when such resin composition is used aiming at providing the above properties as desired, the kinds of the high molecular materials (a) and the molecular design among the components are properly determined so as to meet the requirements.

However, any of the known resin compositions curable with an active energy is still not sufficient in view of the adhesiveness with various substrates even in the case where it is so designed in the above way.

In order to solve this problem, there have been made proposals to add an auxiliary capable of forming a complex with a metal such as a specific heterocyclic compound or a coupling agent to such resin composition, whereby improving its adhesiveness with a metallic substrate as disclosed in Japanese Laid-open Patent Applications No. 5934/1976 and No. 24035/1983.

However, there is still an unsolved problem in the case of any of these proposals, that the additive will cause oxidation or corrosion on the resin composition after the lapse of time.

Other than the above proposals, there has been proposed a high molecular material comprising a graft copolymerized polymer having polar groups on its graft chains aiming at obtaining a cured composition exhibiting a sufficient adhesiveness with a substrate without addition of such additive as mentioned above by Japanese Lain-open Patent Application No. 283645/1986. The resin composition curable with an active energy ray containing said high molecular material to be provided by this publication is such that makes it possible to realize an improvement in the adhesiveness of the resulting paint film with a substrate and also in its durability without using such additive as mentioned above. However, even for such resin composition as described in the above publication, there still remains the unsolved problem of how to determine the molecular structures for the high molecular weight materials to be used in preparing resins having the desired properties. In fact, in general, it is technically difficult to synthesize a desirable graft copolymerized polymer so that it has a predetermined molecular weight and a predetermined content for the graft chains and it has a desired weight average molecular weight in the range from 50,000 to 350,000.

In order to provide desired enhancement in the developing properties upon formation of a pattern, in other words, in the dissolving rate of unpolymerized part, the swelling of polymerized part, the sensitivity as a result of these factors, the sharpness of the resulting pattern and the controlling ability of the resolution, it is necessary for the number average molecular weight of the high molecular material involved to be not excessively small. In the case of a graft copolymerized polymer, to connect a plurality of graft chains having a length sufficient enough to provide an effective adhesiveness with its trunk chain of a relatively large molecular weight to thereby make the resulting graft copolymerized polymer to have a desired number average molecular weight is generally recognized as being difficult because of steric hindrance in this technical field.

In the case where the number average molecular weight of the high molecular material involved is excessively small, when a pattern is formed using such high molecular material, there are limits for the developing properties, that is, the dissolving rate of unpolymerized part, the swelling of polymerized part, the sensitivity as a result of these factors, the sharpness of the resulting pattern and the controlling allowance of the resolution.

SUMMARY OF THE INVENTION

This invention has been accomplished in view of the problems as described above and an object of this invention is to provide an improved resin composition curable with an active energy ray such as ultraviolet ray or electron beam which is capable of being laminated in a desired pattern on a copper-coated laminate for use as a printed board or on a plate of metal, glass, ceramics or plastic.

Another object of this invention is to provide an improved resin composition curable with an active energy ray which exhibits an excellent adhesiveness with a substrate without addition of any auxiliary.

A further object of this invention is to provide an improved resin composition curable with an active energy ray which exhibits excellent developing properties upon formation of a pattern.

A still further object of this invention is to provide an improved resin composition curable with an active energy ray which may be easily controlled so as to exhibit desired properties upon application purposes.

DETAILED DESCRIPTION OF THE INVENTION

The resin composition curable with an active energy ray to attain the above objects of this invention is one that comprises:

(i) a graft copolymerized polymer having a number average molecular weight of 5,000 or more and a weight average molecular weight of 50,000 or less which comprises a trunk chain composed mainly of structural units derived from at least one monomer (hereinafter referred to as "monomer A") selected from the group consisting of alkyl methacrylates, acrylonitrile and styrene and has graft chains having structural units derived from at least one monomer (hereinafter referred to as "monomer B") selected from the group consisting of the monomers represented by the following formula I and other monomers presented by the formula II:

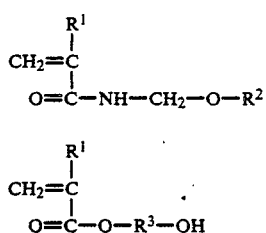

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

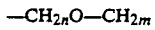

(wherein $2 \leq m+n \leq 6$, $n \neq 0$ and $m \neq 0$), or a phenylalkyl group represented by the formula:

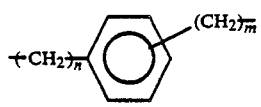

(wherein $2 \leq m+n \leq 4$, or the case where $n=0$ or $m=0$ is contained), added to said trunk chain; (ii) a linear polymer having a number average molecular weight of 50,000 or more and a weight average molecular weight of 350,000 or less and having a glass transition temperature of 60° C. or more which comprises structural units derived from at least one monomer (hereinafter referred to as "monomer C") selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (monomer B) selected from the group consisting of the monomers represented by said formula (I) and the monomers represented by said formula (II);

(iii) an epoxy resin containing at least one compound having one or more epoxy groups in one molecule;

(iv) a monomer having an ethylenically unsaturated bond; and (v) a polymerization initiator capable of generating a Lewis acid by irradiation of an active energy ray.

In constituting the above graft copolymerized copolymer (i), specific examples of the monomers to be used for constitution of the trunk chain are such that the main component comprises one or more of alkyl methacrylate, acrylonitrile and styrene as described above. As for the monomers to be used for constitution of the graft chain, in addition to the monomer selected from those represented the foregoing formulas I and II, it is possible to together use a polar monomer selected from the group consisting of acrylic monomers containing amino group or alkylamino group, acrylic or vinyl monomers containing carboxyl group, N-vinylpyrrolidone and its derivatives, and vinylpyridine and its derivatives, in case where necessary. In addition, it is possible to use a hydrophobic monomer as the component of the copolymerization in an amount of about 25 mol % or less.

The above graft copolymerized polymer (i) to be used in the composition of this invention can be prepared according to the known methods, specifically by various methods as disclosed in "Base and Application of Polymer Alloy" p.10-35 (edited by Polymer Society of Japan, published by Tokyo Kagaku Dojin K.K., 1981). Examples of these methods include (1) the chain transfer method, (2) the method by use of radiation, (3) the oxidation polymerization method, (4) the ion graft polymerization method and (5) macromonomer method.

In accordance with any of these methods, the above graft copolymerized polymer (i) can be properly prepared using the foregoing monomers A and B under proper polymerization conditions which make it possible to obtain a desired graft copolymerized polymer having a number average molecular weight of 5,000 or more and a weight average molecular weight of 50,000 or less.

Among the above methods of (1) to (5), the methods of (4) and (5) are preferred since the lengths of the graft chains may be easily uniformed. And, the macromonomer method of (5) is most preferred in view that it is advantageous in design of materials.

The foregoing linear polymer (ii) may be properly prepared in accordance with the conventional polymerization method using the foregoing monomer C as the main component and also using the foregoing monomer B under properly selected polymerization conditions which permit production of a linear polymer having a number average molecular weight of 50,000 or more and a weight average molecular weight of 350,000 or more and having a glass transition temperature of 60° C. or more.

In this case, as for the monomer B, i.e. at least one monomer selected from the group consisting of the monomers represented by the foregoing formula (I) and the monomers represented by the foregoing formula (II), it is preferred to add the monomer B in an amount of 5 to 30 mol % for the following reasons. That is, when more than 30 mol % of the monomer B is incorporated into a linear polymer to be obtained, there are disadvantages that the polar group content in a cured paint film will be undesirably heightened and because of this, any improvement cannot be attained in its adhesiveness with a substrate, and in addition to this, the resulting cured film will be such that is poor in the water proof. On the other hand, when less than 5 mol % of the monomer B is incorporated into a linear polymer to be obtained, not only the adhesiveness with substrate but also the effects of a paint film as the binder will be insufficient.

In order for the resulting linear polymer to have a high glass transition temperature and to contribute in heightening the water proof for the resulting cured film, among the foregoing monomers C, methylmethacrylate, isobornylmethacrylate, isobornylacrylate, tricyclodecaneacrylate or tricyclodecanemethacrylate is most desired.

The foregoing epoxy resin (iii) which contains at least one compound having one or more epoxy groups in one molecule to be used in the resin composition according to this invention is a component which permits the said resin composition to exhibit high sensitivity and satisfactory curability in the presence of the foregoing polymerization initiator (v) with the action of an active energy ray and in addition thereto, imparts better adhesiveness with a substrate, water proof, resistance against chemicals, dimensional stability, etc., to the resulting cured film constituted with the said resin composition, when it is formed by applying the said resin composition in liquid state on a substrate of glass, plastics, ceramics, etc., followed by curing, or when it is used in the form of a dry film adhered on a substrate.

This is not a particular limitation for the epoxy resin (iii) as long as it is an epoxy resin that contains at least one kind of compound having one or more epoxy groups in one molecule.

However, in order for the resulting resin cured film from the resin composition of this invention to have desired resistance against chemicals, mechanical strength and high durability as a structured member, in order to improve the resolution of a pattern comprising the resin cured film to be formed and also in order to improve the work efficiency at the time of forming various patterns comprising the resin cured film on a substrate, it is desired to use an epoxy resin containing at least one compound having two or more epoxy groups in one molecule.

Examples of such epoxy resin containing two or more epoxy groups in one molecule include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula III:

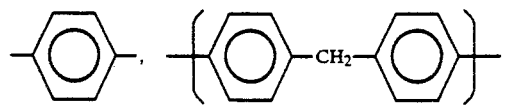

or an alkyl group), and mixtures of two or more of them.

Specific examples of these polyfunctional epoxy resins include those as mentioned in the following. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.), and Epicrone 800 (trade name, produced by Dainippon Ink Kagaku K.K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438, and 439 (trade names, produced by Dow Chemical Co.),etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.) etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trymethylolpropane triglycidyl ether, diglycidyl ether of hydrogenated bisphenol A, 2.2-dibromoneopentylglycol diglycidyl ether, etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkylenoxide, a diglycidyl ether of an addition product of bisphenol S added with 2 to 16 mols of alkyleneoxide.

As the foregoing compound having an epoxy group in one molecule, there can be mentioned olefine oxide, octylene oxide, butylglycidyl ether, glycidylmethacrylate, acrylglycidyl ether, styrene oxide, phenylglycidyl ether, n-butylphenolglycidyl ether, 3-pentadecylphenylglycidyl ether, cyclohexane vinyl monoxide, α-pinene oxide, glycidylesters of tert-carboxylic acids, and mixture of these compounds.

The monofunctional epoxy resins comprising the above compounds may be selectively used alone or in

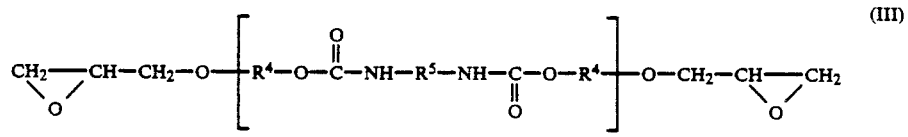

(wherein R⁴ represents an alkyl group or an oxyalkyl group, R⁵ represents combination with the foregoing polyfunctional epoxy resin.

The foregoing monomer (iv) having an ethylenically unsaturated bond to be used in the resin composition according to this invention is a component for permitting the said composition to exhibit curability with an active energy ray, particularly imparting excellent sensitivity to an active energy ray to the said composition, similarly as the above-mentioned epoxy resin (iii). The said monomer (iv) should preferably have a boiling point of 100° C. or higher under atmospheric pressure, having preferably two or more ethylenically unsaturated bonds, and various known monomers curable by irradiation of an active energy ray can be used.

Specific examples of such monomer having two or more ethylenically unsaturated bonds include (a) acrylic acid esters of methacrylic acid esters of polyfunctional epoxy resins having two or more epoxy groups in one molecule, (b) acrylic acid esters or methacrylic acid esters of alkyleneoxide addition products of polyhydric alcohols, (c) polyester acrylates having acrylic acid ester group at the terminal ends of the molecular chains of polyesters having molecular weights of 500 to 3000 comprising dibasic acid and dihydric alcohol, (d) the reaction products between polyisocyanates and acrylic acid monomers having hydroxyl groups. The above monomers (a)-(d) may be urethane-modified products having urethane bonds in the molecules.

Examples of the monomer belonging to (a) include acrylic acid or methacrylic acid esters of polyfunctional epoxy resins to be used for formation of the foregoing epoxy resin (iii).

Examples of the monomer belonging to (b) include ethyleneglycol di(meth)acrylate, diethyleneglycol di(meth)acrylate, polyethyleneglycol di(meth)acrylate, 1,6-hexanediol di(meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be used.

The monomers belonging to (c) may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomer belonging to (c) and having urethane bonds of polyester include those known under the trade names of Aronix M-1100, Aronix M-1200, (both produced by Toa Gosei Kagaku K.K.).

The monomers belonging to (d) may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K.K.), etc. The hydroxyl containing acrylic monomer as herein mentioned may include typically (meth)acrylic acid esters, preferably hydroxyethyl (meth)acrylate, hydroxypropyl (meth)acrylate. It is also possible to use other acrylic monomers containing hydroxyl group(s), particularly those represented by the foregoing formula I to be used for the graft chains in the case of the foregoing graft copolymerized polymer (i).

In addition to the monomers having two or more ethylenically unsaturated bonds as mentioned above, it is also possible to use monomers having only one ethylenically unsaturated bond as mentioned below together with these monomers.

To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractonemodified hydroxyalkyl(meth)acrylate, tetrahydrofurfulyl acrylate, phenoxyethyl acrylate; and others.

By use of the above monomer (iv) having ethylenically unsaturated bonds, high sensitivity and satisfactory curability to an active energy ray can be imparted to the resin composition for formation of a resin cured film in this invention.

The foregoing polymerization initiator (v) capable of generating a Lewis acid with irradiation of an active energy ray to be used in the active energy ray curable resin composition according to this invention is a component for curing the epoxy resin (iii) as mentioned above with the action of the Lewis acid, which permits the said resin composition to exhibit a high sensitivity and desired curability to an active energy ray. As such a polymerization initiator (v), there may be preferably used, for example, aromatic onium salt compounds having photosensitivity containing an element belonging to the groups VIa as disclosed in Japanese Patent publication No. 14278/1977 or aromatic onium salt compounds having photosensitivity containing an element belonging to the group Va as shown in Japanese Patent publication No. 14279/1977 or aromatic halonium salts having photosensitivity as shown in Japanese Patent publication No. 147277/1977. These aromatic onium salt compounds or aromatic halonium salts all have the characteristic of curing the epoxy resin (iii) by releasing a Lewis acid with irradiation of an active energy ray.

The aromatic onium salt compounds having photosensitivity of the element belonging to the group VIa or the group Va may include typically the compounds of the following formula IV:

$$[(R^3)_a(R^4)_b(R^5)_cX]_d{}^+[MQ_e]^{-(e-f)} \qquad (IV)$$

(wherein $R^3$ is a monovalent organic aromatic group, R monovalent organic aliphatic group selected from alkyl groups, cycloalkyl groups and substituted alkyl groups, $R^5$ is a polyvalent organic group for constituting heterocyclic or fused ring structure selected from aliphatic groups and aromatic groups, X is an element belonging to the group VIa selected from sulfur, selenium and tellurium or an element belonging to the group Va selected from nitrogen, phosphorus, arsenic, antimony and bismuth, M is a metal or metalloid and Q is halogen, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and d=e−f).

On the other hand, the photosensitive aromatic halonium salt may be exemplified by the following formula V:

$$[(R^6)_g(R^7)_hX]_i{}^+[MQ_j]^{-(k-l)} \qquad (V)$$

(wherein $R^6$ is a monovalent aromatic organic group, $R^7$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to k-l, j is an integer of 2 to 7 which is equal to the valence of M, and k is an integer greater than one but up to 8).

Specific examples of the photosensitive aromatic onium salt compounds containing an element belonging to the group VIa or the group Va may include the photosensitive aromatic onium salts of the elements belonging to the group VIa as shown below:

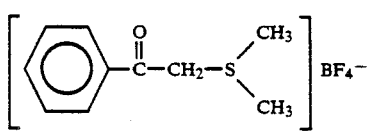

a)

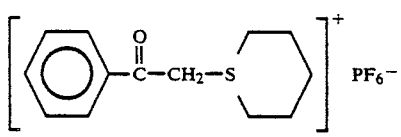

b)

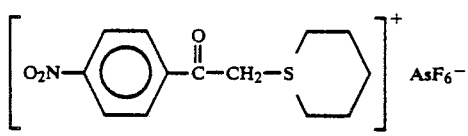

c)

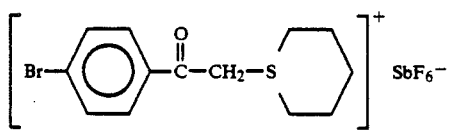

d)

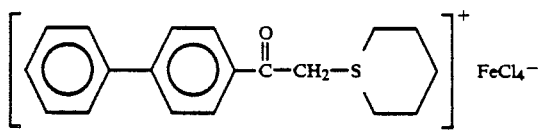

e)

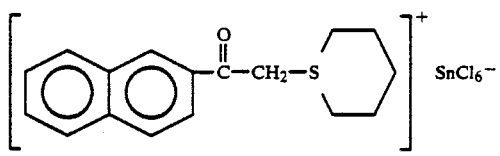

f)

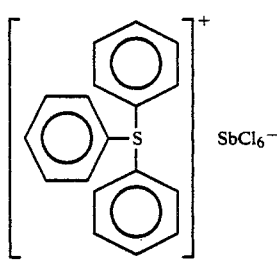
g)
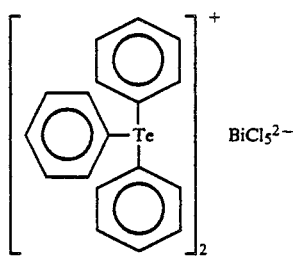
h)
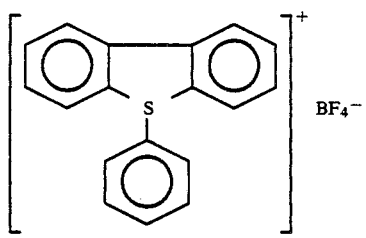
i)
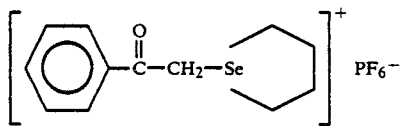
j)
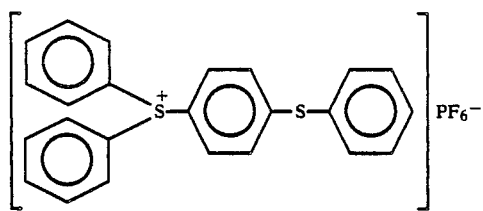
k)
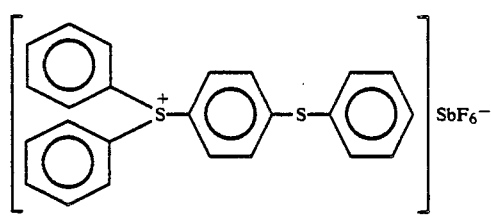
l)
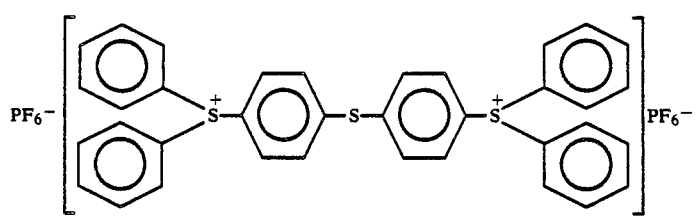
m)

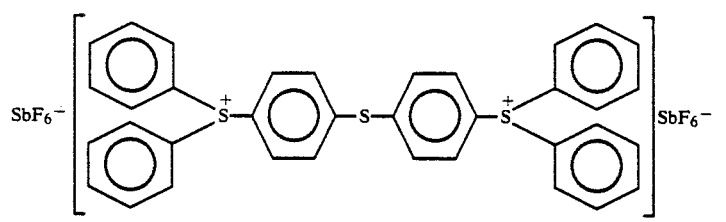
and photosensitive aromatic onium salts of the elements belonging to the group Va as shown below:
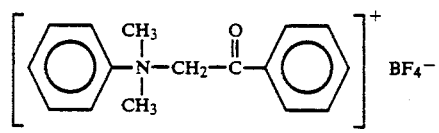
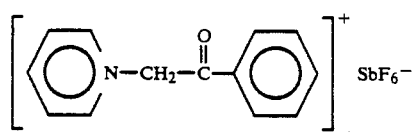
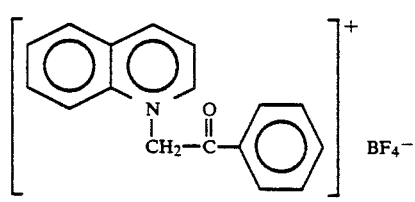
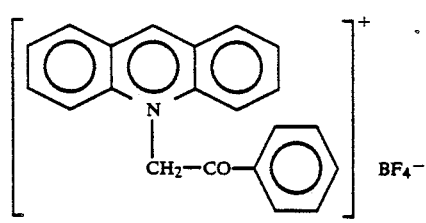
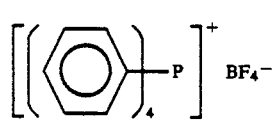
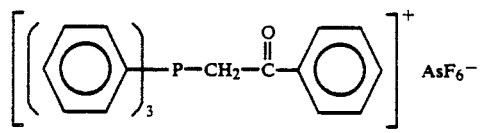
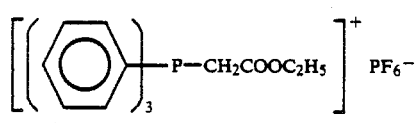
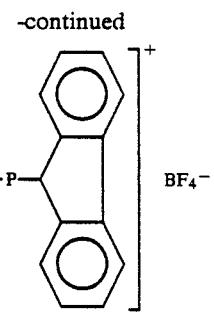
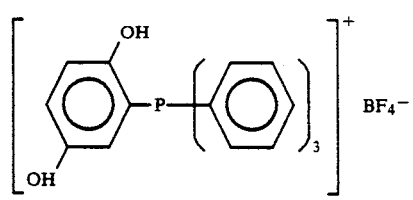
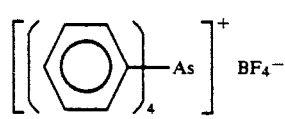
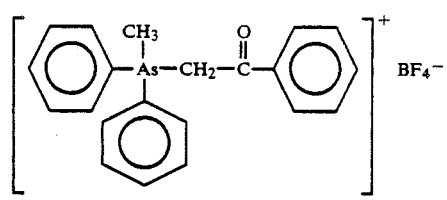
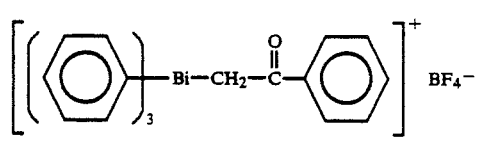
Specific examples of the photosensitive aromatic halonium salts include, for example:
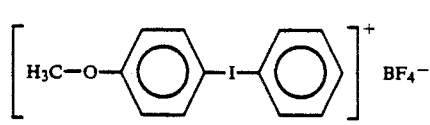
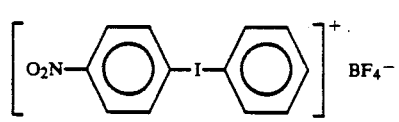

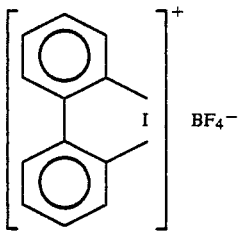

C)

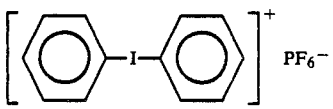

D)

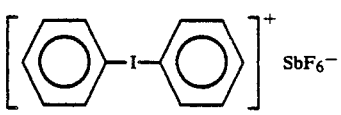

E)

In addition to the above polymerization initiator (iv), it is possible to use a proper known hardener selected from polyamines, polyamides, acid anhydrides, boron trifluorideamine complexes, imidazoles, complexes of imidazoles with metal salts, in case where necessary.

The active energy ray curable resin composition according to this invention is one that is cured with irradiation of an active energy ray. In the case where there are used a graft copolymerized polymer (i) and/or a linear polymer (ii) respectively having photoloymerizabilily and an active energy ray with a wavelength of 250 nm to 450 nm, it is desired to place a radical polymerization initiator having the properties of being activated with the action of an active energy ray, forming organic free radicals and initiating radical polmerization in the said resin composition.

Specific examples of such radical polymerization initiators include benzyl ether: benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis (N,N-diethylamino)benzophenone benzophenone methyl ether and the like; anthraquinones such as 2-ethylanthraquinone, 2-tertbutylanthraquinone and the like; xanthones such as 2,4-dimethylthioxanthone, 2,4-diisopropylthioxathone and the like; acetophenones such as 2,2-dimethoxy-2-phenylacetophenone, α, α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-on (e.g. Darocure 1116, produced by Merck Co.): 2-hydroxy-2-methyl-1-phenylpropane-1-on (e.g. Darocure 1173, produced by Merck Co.): etc., as preferable ones.

In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

The constitutional ratios of the foregoing graft copolymerized polymer (i), linear polymer (ii), epoxy resin (iii), monomer (iv) and polymerization initiator (v) for the active energy ray-curing resin composition according to this invention are properly determined upon the application purpose.

In a preferred embodiment, the weight ratio of the graft copolymerized polymer (i) to the linear polymer (ii) is desired to be such that (i):(ii) is in the range of from 80:20 to 50:50 in parts by weight.

This situation is an important factor for the active energy ray-curing resin composition according to this invention to exhibit a desired adhesiveness to a substrate based on the graft copolymerized polymer (i) and a desired patterning property based on the linear polymer (ii).

In addition to the above, the weight ratio of the sum of the graft copolymerized polymer (i) and the linear polymer (ii) to the sum of the epoxy resin (iii) and the monomer (iv) is desired to be such that [(i)+(ii)]:[(iii)+(iv)] is in the range of from 100:50 to 100:200 in parts by weight.

The weight ratio of the epoxy resin (iii) to the monomer (iv) is desired to be such that (iii):(iv) is in the range of from 25:75 to 75:25 in parts by weight.

The amount of the polymerization initiator (v) to be contained in the resin composition of this invention is desired to be such that [(i)+(ii)+(iii)+(iv)]:(v) is in the range of from 100:1 to 100:10 in parts by weight.

Further, in the case where the foregoing radical polymerization initiator or/and the foregoing photopolymerization accelerator is used, the sum amount (vi) of one of them or both of them is desired to be such that [(i)+(ii)+(iii)+(iv)]: (vi) is in the range of from 100:1 to 100:10 in parts by weight.

The active energy ray-curing resin composition according to this invention may further contain additives such as catalysts for condensation crosslinking, heat polymerization inhibitors, colorants such as dyes and pigments, fillers, heat stabilizers such as hydroquinone or paramethoxyphenol, adhesion promotors, plasticizers, extender pigments such as silica or talc, leveling agents of imparting coating suitability, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant, there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used.

As the solvent to be used when employing the active energy ray-curing resin composition for formation of a resin cured film in the form of a liquid or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after patterning.

The active energy ray-curing resin composition according to this invention as explained above may be applied onto a substrate in accordance with any of the conventional methods. Specific examples of such method will be below illustrated:

(1) In the case of forming a cured film coat on a substrate, the active energy ray-curing resin composition is liquid state is applied onto the substrate to form a liquid coat thereon which is followed by evaporation to dryness, then the resultant dried coat is cured by irradiating it with an active energy.

(2) In the case of forming a protective cured layer in the form of a desired pattern on a substrate, the active energy ray-curing resin composition in liquid state is applied onto the substrate to form a liquid coat thereon which is followed by evaporation to dryness, the resultant dry layer is scanned with laser beam in a desired pattern, and the unexposed portion is etched off with a proper solvent such as 1,1,1-trichloroethane to thereby form a protective cured layer in the form of a desired pattern on the substrate.

(3) In the case of forming a protective cured layer coat in the form of a desired pattern on a substrate, the active energy ray-curing resin composition in liquid state is applied onto the substrate to form a liquid coat thereon which is followed by evaporation to dryness, a photomask having a pattern with a desired shape which does not transmit any active energy ray is superposed on the resultant dry film layer, then exposure with an active energy ray is effected from above the photomask, and the unexposed portion is removed by a proper solvent such as 1,1,1-trichloroethane to thereby form a protective cured layer in the form of a desired pattern on the substrate.

(4) In the case of forming a photosensitive dry film and laminating said dry film on a substrate, the active energy ray-curing resin composition in liquid state is applied onto a polyethylene terephthalate film to form a liquid coat thereon which is followed by evaporation dryness, whereby obtaining a photosensitive dry film on the said polyethylene terephthalate film, the resultant is laminate onto a substrate in accordance with the conventional lamination method to obtain a laminate, and the photosensitive dry film as laminated on the substrate is cured by irradiating it with an active energy ray in the same way as in the above method (1).

If the resulting cured photosensitive film is desired to have been shaped in a desired pattern, the above dry film as laminated on the substrate is treated in the same way as the above method (2) or (3).

In the case where the active energy ray-curing resin composition is one that contains the monomer represented by the foregoing formula (1), the cured film as obtained in any of the above methods (1) to (4) is desired to be further subjected to heat-treatment at a temperature of 80° C. to 200° C. to thereby condensedly cure it.

The active energy ray to be used for curing the active energy ray-curing resin composition of this invention or for the pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

1. Provision of each of the components (i) to (v) for the preparation of a active energy ray-curing resin composition of this invention Preparation of a graft copolymerized polymer (i)

Radical chain transfer polymerization of 80 parts by weight of 2-hydroxyethylmethacrylate and 20 parts by weight of butylacrylate was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 30 parts by weight of the said macromonomer and 70 parts by weight of methylmethacrylate was carried out in methyl cellosolve solvent to thereby obtain a graft copolymerized polymer having a weight average molecular weight of about 40,000 and a number average molecular weight of about 5,500.

A linear polymer (ii)

There was provided a linear acrylic copolymer obtained by polymerizing methylmethacrylate. This linear acrylic copolymer is one that has a number average molecular weight of about 70,000 and a weight average molecular weight of about 250,000.

An epoxy resin (iii)

There were provided the following two epoxy resins (iii)-(i) and (iii)-(2):
(iii)-(i): Epicoat 152 (trade name, produced by Yuka Shellepoxy K.K.)(epoxy resin of cresol novolac type: epoxy equivalent of 172-179)
(iii)-(2): Celloxide 2021 (trade name, produced by Daiseru Kagaku K.K.)(epoxy resin of alicyclic type: epoxy equivalent of 128-145)

A monomer having an ethylenically unsaturated bond (iv)

There was provided the following acrylic ester: acrylic ester (100% esterificated) of Epicoat 828 (trade name, produced by Yuka Shellepoxy K.K.)(epoxy resin of bisphenol A type: epoxy equivalent of 183–193)

A polymerization initiator (v)

There were provided the following two polymerization initiators (v)-(1) and (v)-(2):
(v)-(1): the foregoing photosensitive aromatic onium salt (n)
(v)-(2): IRGACURE 651 (trade name, produced by Ciba Geigy Co.) [photopolymerization initiator for the above monomer (iv)]

2. Preparation of an active energy ray-curing resin composition of this invention The above components (i) to (v)-(2) were well mixed by the weight ratios as below shown in accordance with the conventional mixing technique to thereby obtain the active energy ray-curing resin composition, in which there were used the additives as below shown.

| Component | Parts by weight |
|---|---|
| (i) | 50 |
| (ii) | 50 |
| (iii)-(1) | 50 |
| (iii)-(2) | 20 |
| (iv) | 50 |
| (v)-(1) | 8 |
| (v)-(2) | 10 |
| methyl cellosolve | 200 |
| methylethyl ketone | 100 |

3. Preparation of a resin cured film

The thus obtained active energy ray-curing resin composition in liquid state was applied onto the cleaned surface of a glass plate to form a liquid coat of about 80 $\mu m$ in thickness, followed by air-dryness at 100° C. for 15 minutes to obtain a dry film of about 40 $\mu m$ on the glass plate.

The glass plate having said dry film thereon was exposed to active energy rays (maximum irradiation energy: 100 mW/cm$^2$) from an ultra-high pressure mercury lamp for 60 seconds. Thereafter, it was heat-treated at 150° C. for 30 minutes.

The resultant was subjected to reflux treatment in 1% caustic soda aqueous solution for 10 hours.

The thus obtained laminate was tested and as a result, it was found that the exposed (cured) resin film is firmly adhered to the glass plate, and there were not observed any chloroisis or bulging phenomena on the resultant film even after storage for a long period of time.

EXAMPLE 2

The active energy ray-curing resin composition obtained in Example 1 was applied by the conventional bar coater onto the cleaned surface of a Pyrex glass plate of 10 cm by 10 cm in size (trade name: Corning 7740. produced by Corning Glass Wear Co.), cleaned by way of ultrasonic cleaning in a cleaning liquid (trade name: Dafuron, produced by Daikin Kohgyo K.K.), to form a liquid coat thereon, followed by air-dryness to obtain a dry film of about 50 $\mu m$ in thickness in the same way as in Example 1.

Subsequently, on the dry film laminated on the glass plate, there was laminated a polyethylenetere phthalate film (Lumirror-T type, produced by Toray K.K.) of 16 $\mu m$ in thickness. Then, a mask for testing the resolution was superposed thereon.

The resultant was subjected to pattern exposure for 20 seconds using the conventional ultra-high pressure mercury lamp of generating collimated UV ray, the luminous flux density of the UV ray from which is to be 10 mW/cm$^2$ near 254 nm.

After completion of the exposure, the polyethyleneterephthalate film was removed. The remaining was engaged in spray-development with 1,1,1-trichloroethane at 35° C. for 60 seconds, wherein the development was effectively and stably proceeded and as a result, there was precisely reproduced a pattern of 150 $\mu m$ line width and 150 $\mu m$ in space.

After completion of the development, the glass plate having the cured dry film thereon was subjected to heat-treatment of 80° C. for 10 minutes, and it was exposed to UV ray with 10 J/cm$^2$, followed by heat-treatment at 150° C. for 30 minutes.

As a result of conducting cross-cut tape removal test using a cellophane tape on the resultant, there was recognized 100/100 adhesion, and it was found that the cured dry film is firmly adhered to the glass plate. Further, the resultant was immersed in a NaOH aqueous solution of pH 12 at 80° C. for 24 hours, washed with water and air-dried. Then, it was again subjected to the above cross-cut tape removal test. There was not observed any reduction in the adhesion of the cured dry film with the glass plate.

EXAMPLE 3

1. Provision of each of the components (i) to (v) for the preparation of an active energy ray-curing resin composition of this invention Preparation of a graft copolymerized polymer (i)

The procedures for the preparation of the macromonomer in Example 1 were repeated, except that there were used 50 parts by weight of 2-hydroxyethylmethacrylate and 50 parts by weight of butoxymethylacrylamide, to thereby obtain a macromonomer having a methacryloyl group at one terminal end of the molecular chain.

The result of the measurement by the known GPC method gave a value of about 2,000 for the number average molecular weight of the resultant macromonomer.

Solution polymerization of 20 parts by weight of the said macromonomer and 80 parts by weight of methylmethacrylate was carried out in a solvent containing methyl cellosolve and methylethy ketone by the weight ratio of 60:40 to thereby obtain a thermosetting graft copolymerized polymer having a number average molecular weight of about 5,000 and a weight average molecular weight of about 30,000.

A linear polymer (ii)

There was provided a linear acrylic copolymer obtained by polymerizing methylmethacrylate and tricyclodecanmethacrylate in the molar ratio of 70:30. This linear acrylic copolymer is one that has a number average molecular weight of about 60,000 and a weight average molecular weight of about 260,000.

An epoxy resin (iii)

There were provided the following two kinds of epoxy resins (iii)-(1) and (iii)-(2):
(iii)-(1): Epicoat 1001 (trade name, produced by Yuka Shellepoxy K.K.)(epoxy resin of bisphenol A type: epoxy equivalent of 450–500)

(iii)-(2): Celloxide 3000 (trade name, produced by Daiseru Kagaku K.K.)(epoxy resin of alicyclic type: epoxy equivalent of 93.5)

A monomer having an ethylenically unsaturated bond (iv)

There was provided the following acrylic ester: acrylic ester (100% esterificated) of Epicoat 152 (trade name, produced by Yuka Shellepoxy K.K.)(epoxy resin of cresol novolak type: epoxy equivalent of 172-179)

A polymerization initiator (v)

There were provided the following two kinds of polymerization initiators (v)-(1) and (v)-(2):
(v)-(1): the foregoing photosensitive aromatic onium salt (n)
(v)-(2): IRGACURE 651 (trade name, produced by Ciba Geigyo Co.)[Photopolymerization initiator for the above monomer (iv)]

2 Preparation of an active energy ray-curing resin composition of this invention The above components (i) to (v)-(2) were well mixed by the weight ratios as below shown in accordance with the conventional mixing technique to thereby obtain the active energy ray-curing resin composition, in which there were used the additives as below shown.

| Component | Parts by weight |
|---|---|
| (i) | 80 |
| (ii) | 20 |
| (iii)-(1) | 60 |
| (iii)-(2) | 30 |
| (iv) | 90 |
| (v)-(1) | 8.5 |
| (v)-(2) | 10 |
| methyl cellosolve | 220 |
| methylethyl ketone | 100 |

3 Preparation of a protective resin cured film on a printed board

On a printed board comprising conductor circuit composed of 60 μm thick copper foil formed on a glass cross epoxy resin substrate, there was formed a liquid coat of the thickness to be 50 μm when dried by applying the resin composition in liquid state obtained in the above step 2 by way of the conventional roll coater. The liquid coat was then air-dried at 100° C. for 3 minutes.

After cooling, a solder mask pattern was superposed on the dry film and subjected to pattern exposure for 35 seconds using the conventional ultra-high pressure mercury lamp of generating collimated UV ray, the luminous flux density of the UV ray from which is to be 7 mW/cm² near 365 nm and the collimation amplitude is to be 3°. After completion of the exposure, the resultant was engaged in spray-development with 1,1,1-trichloroethane at 20° C. for 50 seconds. The development was stably proceeded and as a result, there was formed a clear pattern. After completion of the development, the cured dry film on the printed board was air-dried and further irradiated with UV ray from the above mercury lamp for 5 minutes, followed by heat-treatment at 150° C. for 15 minutes to thereby complete the formation of a patterned resin cured protective film on the printed board.

As a result of examining the resultant protective film, it was found that the film is excellent in the resistance against not only acids but also alkalis and also in the resistance against other chemicals.

What we claim is:

1. A resin composition curable with an active energy ray comprising:
   (i) a graft copolymerized polymer having a number molecular weight of 5,000 or more and a weight average molecular weight of 50,000 or less which comprises a trunk chain composed mainly of structural units derived from at least one monomer selected from the group consisting of alkyl methacrylates, acrylonitrile and styrene and has graft chains having structural units derived from at least one monomer selected from the group consisting of the monomers represented by the following formula I and other monomers presented by the formula II:

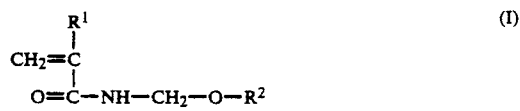

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

(wherein $2 \leq m+n \leq 6$, $n \neq 0$ and $m \neq 0$), or a phenylalkyl group represented by the formula:

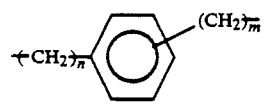

(wherein $2 \leq m+n \leq 4$, or the case where $n=0$ or $m=0$ is contained), added to said trunk chain;
   (ii) a linear polymer having a number average molecular weight of 50,000 or more and a weight average molecular weight of 350,000 or less and having a glass transition temperature of 60° C. or more which comprises structural units derived from at least one monomer selected from the group consisting of methyl methacrylate, ethyl methacrylate, isobutyl methacrylate, t-butyl methacrylate, benzyl methacrylate, acrylonitile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer in amounts from 5 to 30 mole percent selected from the group consisting of the monomers represented by said formula (I) and the monomers represented by said formula (II);
   (iii) an epoxy resin containing at least one compound having one or more epoxy groups in one molecule;
   (iv) a monomer having (v) a polymerization initiator capable of generating a Lewis acid by irradiation of an active energy ray.

2. The resin composition according to claim 1, wherein the weight ratio of said graft copolymerized polymer (i) to said linear polymer (ii) to said linear polymer (ii) is such that (i):(ii) is in the range from 80:20 to 50:50.

3. The resin composition according to claim 1 or claim 2, wherein the weight ratio of the sum of said graft copolymerized polymer (i) and said linear polymer (ii) to the sum of said epoxy resin (iii) and said monomer (iv) is such that [(i)+(ii)]:(iii)+(iv)] is in the range from 100:50 to 100:200.

4. The resin composition according to claim 3, wherein the weight ratio of said epoxy resin (iii) to said monomer (iv) is such that (iii):(iv) is in the range from 25:75 to 75:25.

5. The resin composition according to claim 1, wherein the weight ratio of the sum of said graft copolymerized polymer (i), said linear polymer (ii), said epoxy resin (iii) and said monomer (iv) to said polymerization initiator (v) is such that [(i)+(ii)+(iii)+(iv)]:(v) is in the range from 100:1 to 100:10.

6. The resin composition according to claim 1, wherein said polymerization initiator (v) comprises an aromatic halonium salt compound or an aromatic onium salt compound having photosensitivity containing an element belonging to group VIa or group Va, of the periodic table.

* * * * *

UNITED STATES PATENT AND TRADEMARK OFFICE
CERTIFICATE OF CORRECTION

PATENT NO. : 5,068,259
DATED : November 26, 1991
INVENTOR(S) : HIROMICHI NOGUCHI Page 1 of 4

It is certified that error appears in the above-identified patent and that said Letters Patent is hereby corrected as shown below:

TITLE PAGE:

IN [54] TITLE

"CURBABLE" should read --CURABLE--.

IN [56] REFERENCES CITED

Under Attorney, Agent, or Firm: "Fitzpatrick Cella Harper & Scinto" should read --Fitzpatrick, Cella, Harper & Scinto--.

IN [57] ABSTRACT

Line 10, "molecule," should read --molecule:--.

COLUMN 1

Line 2, "CURBABLE" should read --CURABLE--.

COLUMN 3

Line 38, ""—$CH_{2n}O-CH_{2m}$" should read -- $(CH_2)_nO(CH_2)_m$ --.
Line 50, "(ii)" should read --¶ (ii)--.

COLUMN 4

Line 58, "B,i.e." should read --B, i.e.--.

COLUMN 6

Line 34, "trymethylolpropane" should read --trimethylolpropane--.
Line 41, "alkylenoxide," should read --alkyleneoxide,--.

UNITED STATES PATENT AND TRADEMARK OFFICE
CERTIFICATE OF CORRECTION

PATENT NO. : 5,068,259
DATED : November 26, 1991
INVENTOR(S) : HIROMICHI NOGUCHI It is certified that error appears in the above-identified patent and that said Letters Patent is hereby corrected as shown below:

COLUMN 7

Line 47, "M-1100," should read --M-1100 and--.
Line 48, "M-1200," should read --M-1200--.
Line 65, "hydroxypro-" should read --and hydroxypro- --.

COLUMN 8

Line 36, "ε-caploractonemodified" should read --ε-caprolactone-modified--.

COLUMN 9

Line 4, "R" should read --$R^4$--.

COLUMN 15

Line 32, "photoloymerizability" should read --photopolymerizability--.
Line 39, "ether:" should read --ether;--.
Line 56, "Co.):" should read --Co.);--.
Line 57, "Co.):" should read --Co.);--.

COLUMN 16

Line 40, "promotors," should read --promoters,--.
Line 55, "promotor," should read --promoter,--.

COLUMN 17

Line 13, "is" should read --in--.
Line 46, "whereby" should read --thereby--.
Line 48, "laminate" should read --laminated--.

UNITED STATES PATENT AND TRADEMARK OFFICE
CERTIFICATE OF CORRECTION

PATENT NO. : 5,068,259
DATED : November 26, 1991
INVENTOR(S) : HIROMICHI NOGUCHI Page 3 of 4

It is certified that error appears in the above-identified patent and that said Letters Patent is hereby corrected as shown below:

COLUMN 18

Line 23, "a" should read --an--.
    Line 57, "(iii)-(i)" should read --(iii)-(1)--.
    Line 58, "(iii)-(i):" should read --(iii)-(1):--.

COLUMN 19

Line 58, "7740." should read --7740,-- and
           "Wear" should read --Ware--.
    Line 65, "polyethylenetere phthalate" should read
           --polyethyleneterephthalate--.

COLUMN 20

Line 49, "methylethy" should read --methylethyl--.
    Line 58, "clodecanmethacrylate" should read
           --clodecanemethacrylate--.

COLUMN 21

Line 52, close up left margin.

COLUMN 22

Line 3, "we" should read --I--.
    Line 37, "$(CH_{2n}O)CH_{2m}$" should read -- $(CH_2)_nO(CH_2)_m$ --.
    Line 47 should be indented.
    Line 56, "acrylonitile" should read --acrylonitrile--.
    Line 68, "having" should read --having an ethylenically
           unsaturated bond; and--.

UNITED STATES PATENT AND TRADEMARK OFFICE
CERTIFICATE OF CORRECTION

PATENT NO. : 5,068,259
DATED : November 26, 1991
INVENTOR(S) : HIROMICHI NOGUCHI It is certified that error appears in the above-identified patent and that said Letters Patent is hereby corrected as shown below:

COLUMN 23

Lines 5-6, "to said linear polymer (ii)" (second occurrence) should be deleted.
Line 12, "[(i)+(ii)]:(iii)+(iv)]" should read
--[(i)+(ii)]:[(iii)+(iv)]--.

Signed and Sealed this

Seventh Day of September, 1993

Attest:

BRUCE LEHMAN

*Attesting Officer*    *Commissioner of Patents and Trademarks*